United States Patent [19]
Voisine et al.

[11] Patent Number: 5,298,857
[45] Date of Patent: Mar. 29, 1994

[54] ELECTRICAL ENERGY METER WITH A PRECISION INTEGRATOR FOR CURRENT MEASUREMENT

[75] Inventors: John T. Voisine; Christopher L. Anderson; Robert E. Slaven, all of Lafayette, Ind.

[73] Assignee: Landis & Gyr Metering, Inc., Lafayette, Ind.

[21] Appl. No.: 863,855

[22] Filed: Apr. 6, 1992

[51] Int. Cl.⁵ .......................................... G01R 21/06
[52] U.S. Cl. ................................ 324/142; 324/103 R; 324/107
[58] Field of Search .................. 324/142, 103 R, 107, 324/141; 364/481, 483; 340/653, 657, 660

[56] References Cited

U.S. PATENT DOCUMENTS

| | | | |
|---|---|---|---|
| 3,226,641 | 12/1965 | Miller | 324/142 |
| 4,182,983 | 1/1980 | Heinrich et al. | 324/142 |
| 4,250,552 | 2/1981 | Elms | 324/142 |
| 4,356,446 | 10/1982 | Battocletti | 324/142 |
| 4,368,424 | 1/1983 | Miller | 324/142 |
| 4,473,810 | 9/1984 | Souques et al. | 324/142 |
| 4,591,810 | 5/1986 | Mackenzie et al. | 324/142 |
| 4,596,951 | 6/1986 | Heinrich et al. | 324/142 |
| 4,733,171 | 3/1988 | Milkovic | 324/142 |
| 4,782,287 | 11/1988 | Marx . | |
| 4,801,874 | 1/1989 | Loeffler . | |
| 4,896,106 | 1/1990 | Voisine et al. | 324/142 |
| 5,032,785 | 7/1991 | Mathis et al. | 324/142 |
| 5,053,697 | 10/1991 | Carnel et al. | 324/142 |

OTHER PUBLICATIONS

Landis & Gyr SSM Instruction/Technical Manual, Bulletin 920 (Mar. 1987).

Primary Examiner—Vinh Nguyen
Attorney, Agent, or Firm—Woodard, Emhardt, Naughton, Moriarty & McNett

[57] ABSTRACT

A current measurement circuit for an electrical energy meter of the type having an inductive current pickup which generates a signal proportional to the derivative of current with respect to time in an electrical power line. An underdamped integrator is provided which compensates for nonideal phase characteristics of the inductive current pickup including a phase deviation from 90° at the nominal line frequency. The integrator has a transfer function with a magnitude peak at a frequency below the line frequency and with a phase shift deviating from 90° at the line frequency.

20 Claims, 4 Drawing Sheets

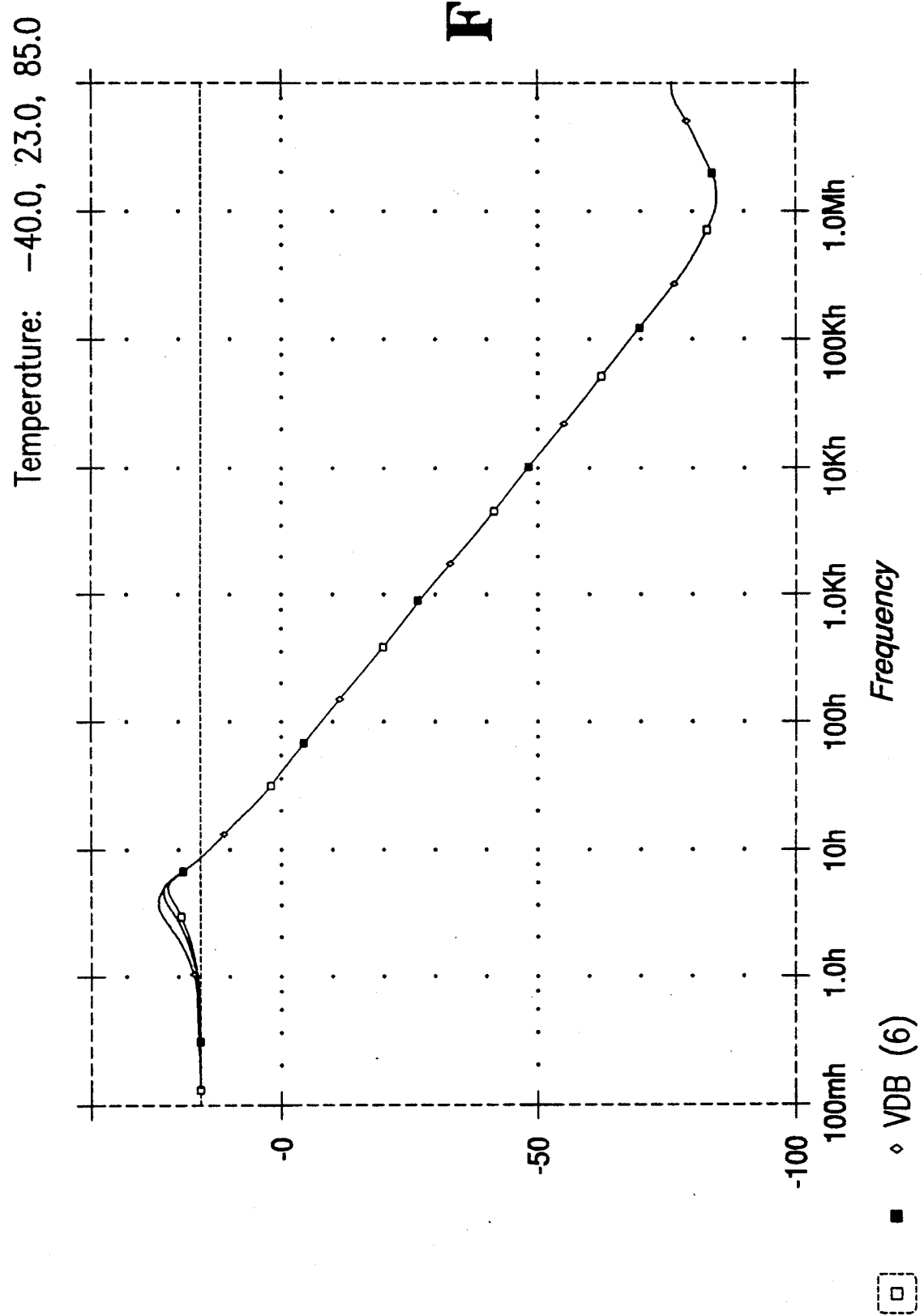

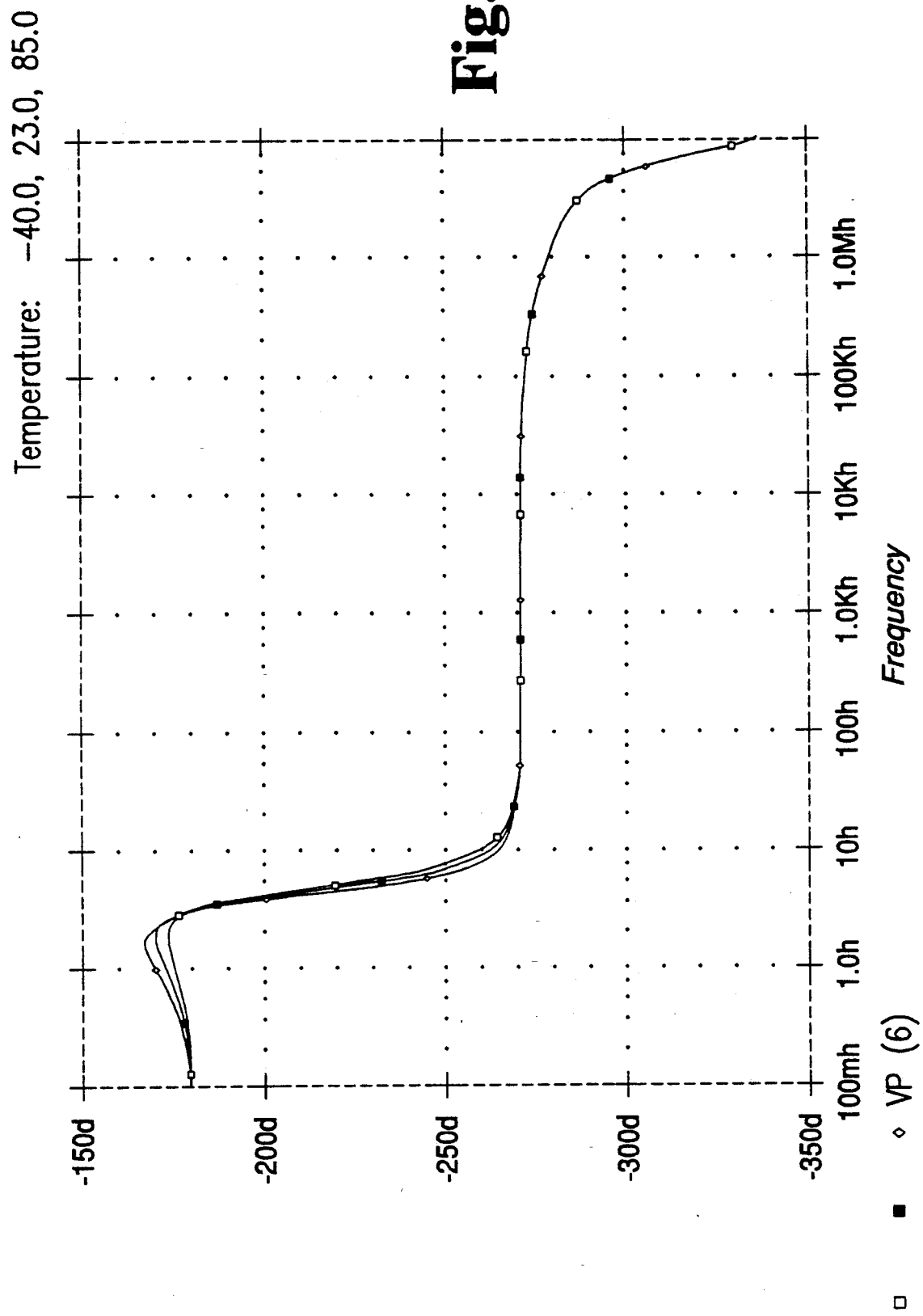

ELECTRICAL ENERGY METER WITH A PRECISION INTEGRATOR FOR CURRENT MEASUREMENT

BACKGROUND OF THE INVENTION

This invention relates to circuits and methods for measuring electrical energy, and more particularly to electrical energy measurement circuits and methods involving current sensors of the type which generate a signal proportional to the derivative of a current with respect to time (di/dt).

Meters for measuring electrical energy conventionally measure current and voltage on the metered power line and multiply the measured current and voltage to produce a signal representative of the electrical power consumed by a load connected to the metered power line. One known way of measuring electrical current is with an inductive current pickup, which produces a signal proportional to di/dt. Current sensors of this type have been referred to as mutual inductance transformers, mutual inductance current transducers, and embedded coils, and are described, for example, in the following patents:

| Patent No. | Inventor | Issue Date |
| --- | --- | --- |
| 3,226,641 | Miller | Dec. 28, 1965 |
| 4,182,983 | Heinrich et al. | Jan. 8, 1980 |
| 4,250,552 | Elms | Feb. 10, 1981 |
| 4,368,424 | Miller | Jan. 11, 1983 |
| 4,473,810 | Souques et al. | Sep. 25, 1984 |
| 4,591,810 | Mackenzie et al. | May 27, 1986 |
| 4,596,951 | Heinrich et al. | Jun. 24, 1986 |
| 5,053,697 | Carnel et al. | Oct. 1, 1991 |

An improved design of an embedded coil is also disclosed in co-pending U.S. patent application Ser. No. 07/833,738, assigned to the assignee of the present invention, which application is hereby incorporated by reference.

Because the output of the embedded coil or other inductive current pickup is a voltage proportional to the derivative of the load current, the current sensor output must be integrated to obtain a signal proportional to the load current. This general concept is illustrated in FIG. 1, and various forms of integrators are disclosed in the above-referenced patents.

Ideally, an inductive current pickup exhibits a phase shift of precisely 90°, which can be offset by a simple integrator circuit consisting of a capacitor in the feedback loop of an operational amplifier (op amp). A basic integrator of this type is shown in the Mackenzie patent referenced above, in which a second integrator having its input connected to a square-wave clock signal is also employed, with the outputs of the two integrators being added together and supplied to a comparator which generates a pulse-width-modulated (PWM) signal having a duty cycle proportional to metered current. A negative feedback path including a low-pass filter is connected between the comparator output and the input to the basic integrator to compensate for errors produced by the integrator and comparator, thus, according to the patent, permitting the use of low-cost inverter circuitry fabricated on an integrated circuit. A similar configuration is disclosed in U.S. Pat. No. 4,596,951 to Heinrich et al., in which one form of the pulse-width modulator includes a capacitor and a plurality of resistive components in the feedback network of an op amp, along with a bypass capacitor connected to the negative regulated reference voltage supply and one of the resistive components in the feedback network.

An integrator with a parallel resistor-capacitor (RC) network in the feedback loop of an op amp connected to a di/dt sensor is disclosed in U.S. Pat. No. 4,182,983 to Heinrich et al., which also relates to a PWM technique.

A similar integrator circuit is shown in U.S. Pat. No. 4,250,552 to Elms, in which the output of the integrator is connected to a twin-T network.

U.S. Pat. No. 5,053,697 to Carnel et al. discloses an active filter connected as an op amp integrator having a feedback capacitor, one end of which is connected to the op amp inverting input, a coupling capacitor connected between the op amp output and the other end of the feedback capacitor, and a gain-adjusting resistor directly connecting the op amp output to its inverting input. The circuit also includes a passive RC filter of the integrator type connected upstream from the two inputs to the op amp, for the stated purpose of compensating for a difference between the phase shift imparted by the active filter and a predetermined value desired for said phase shift.

U.S. Pat. No. 3,226,641 to Miller shows a bridged-T network in the feedback path of an amplifier, the bridge-T network including a capacitor and a T network consisting of two resistors in series, with the common leads of the resistors connected to ground through a second capacitor. A third capacitor is connected in parallel with an input resistor to compensate for secondary inductance of the current transformer.

The actual phase shift exhibited by an inductive current pickup is not precisely 90° due to eddy currents set up in the conductors exposed to the magnetic field and eddy currents in the magnetic material in the flux path. Therefore, an integrator exhibiting a phase shift of precisely 90° is not necessarily the solution to the problem of converting the inductive pickup output signal to a signal proportional to current. Although a desired small deviation from 90° phase shift in the integrator can be achieved by setting the corner frequency of a first-order low-pass filter to a sufficiently low frequency, e.g., under 1 Hz for a desired phase deviation on the order of 0.5°, it has been found that some undesirable trade-of is usually required, either in the form of a resistance value which is excessively high for a desired specification of DC offset, or because the required capacitor is either too large in size, too sensitive to temperature, or more expensive than desired in the increasingly cost-sensitive market for watthour meters and the like.

Thus, there remains a need, in electrical energy meters of the type having a di/dt current sensor, for an improved integrator design offering stability with time and temperature, linear performance, low DC output voltage, low sensitivity to component tolerances and frequency variations, low component count, and compensation for nonideal phase characteristics of embedded coils and the like.

SUMMARY OF THE INVENTION

The present invention provides an improved circuit for electrical energy measurement which includes a current sensor for generating a first signal proportional to the derivative of a current with respect to time in an electrical power line having a nominal line frequency, which is, for example, 60 Hz in the United States and 50

Hz in Europe, the current sensor having a nonideal phase characteristic including a phase deviation from 90° at the nominal line frequency. An underdamped integrator integrates the first signal, compensating for the phase deviation in the nonideal phase characteristic of the current sensor. The integrator has a transfer function with a magnitude peak at a frequency below the line frequency and with a phase shift deviating from 90° at the line frequency.

A general object of the present invention is to provide an improved electrical energy measurement circuit of the type having an inductive current pickup and an integrator for generating a signal proportional to current in a metered line.

Another object is to provide an integrator capable of compensating for the nonideal phase characteristics of real inductive current pickups.

Another object is to provide low sensitivity, particularly low sensitivity of phase shift, to component tolerances and variations in frequency from the nominal line frequency.

Yet another object of the invention is to provide low sensitivity to component tolerances and frequency variations while maintaining low parts count and cost without sacrificing stability with respect to time and temperature.

Through a novel combination of elements as recited in the claims, the present invention provides a low-cost integrator design having stability with time and temperature, linear performance, low DC output voltage, low sensitivity to component tolerances and frequency variations, low component count, and compensation for nonideal phase characteristics of embedded coils and the like.

These and other objects and advantages of the present invention will become more apparent upon reading the following detailed description in conjunction with the accompanying drawings.

BRIEF DESCRIPTION OF THE DRAWINGS

FIGS. 3 and 4 are plots of the closed-loop gain and phase, respectively, of the integrator of FIG. 2.

DESCRIPTION OF THE PREFERRED EMBODIMENT

Figure 1:
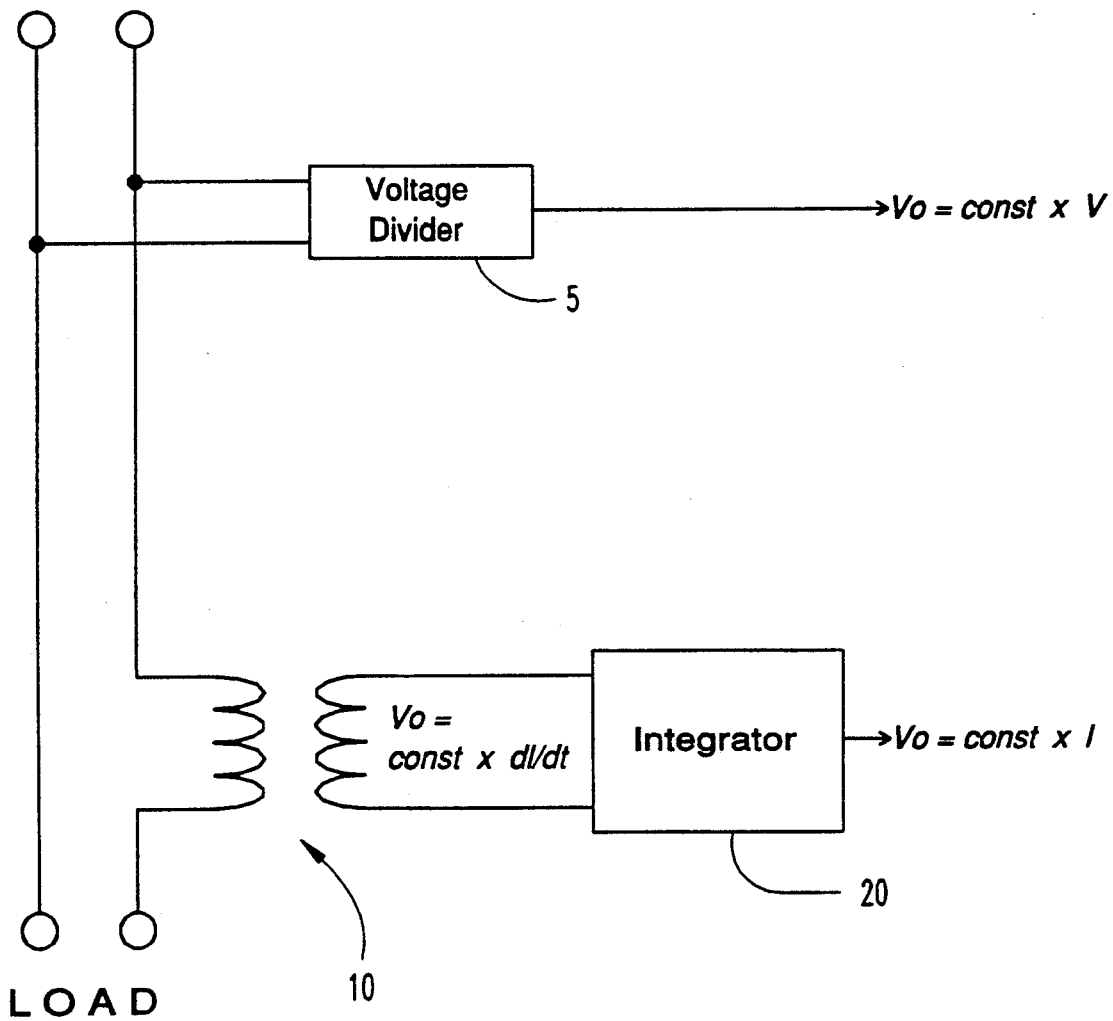
FIG. 1 illustrates the general concept of a di/dt sensor coupled to an integrator in order to produce an output voltage proportional to the line current as well as a circuit for producing an output voltage proportional to the line voltage.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

FIG. 1 illustrates the general configuration of a voltage measurement circuit and current measurement circuit in a watthour meter or the like such as described above in which measured current is multiplied by measured voltage to produce a signal representative of the power consumed by the load at any given time. A resistive voltage divider network 5 is connected across an electrical power line, as shown in FIG. 1, for measurement of the line voltage. A voltage transformer may be used as an alternative. In the preferred embodiment, an embedded coil 10 is connected in series with a load connected to an electrical power line, as shown in FIG. 1, and the secondary winding of the embedded coil is connected to an integrator 20. A preferred form of embedded coil for use with the present invention is disclosed in co-pending U.S. patent application Ser. No. 07/833,738.

Figure 2:
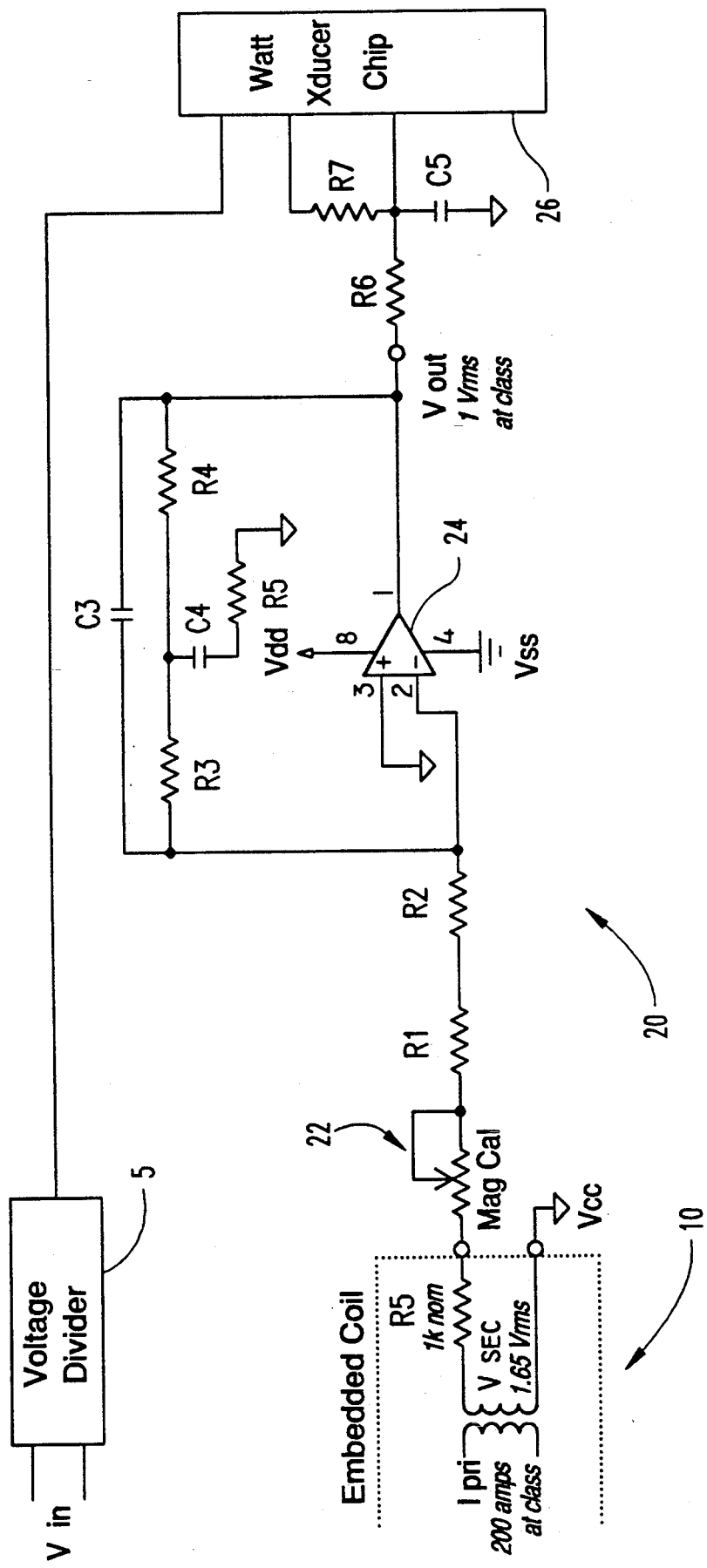
FIG. 2 is an electrical schematic of an embedded coil and precision integrator according to the preferred embodiment of the present invention.

Referring to FIG. 2, the embedded coil in the preferred embodiment produces an output voltage of 1.65 volts RMS on its secondary winding in response to a primary current of 200 amps, and typically has a 1KΩ source resistance ($R_s$). The secondary winding of the embedded coil is connected on one end to signal ground and on the other end to the input of integrator 20 as shown in FIG. 2, with the coil windings connected in a known fashion such that the embedded coil output voltage, as measured between the integrator input and signal ground, is out of phase with the primary current by approximately 90°. A typical phase shift for an actual embedded coil is 90.12°. In one embodiment, integrator 20 is designed to produce a phase shift of 90.12° at 60 Hz so as to precisely offset the phase lag of the embedded coil. However, integrator 20 is preferably designed to produce a phase shift of 90.41° at 60 Hz so as to more than offset the phase lag of the embedded coil and produce a phase angle for the integrator/coil combination which falls between the phase angle of the measured voltage input with minimum power factor (PF) adjustment and the voltage input phase angle with maximum PF adjustment. Power factor adjustment is performed by introducing a phase shift in the voltage measurement circuit and is intended to adjust the phase angle of the voltage input to equal that of the combination of embedded coil and integrator so that the meter reading will be correct for the anticipated load power factor. Those skilled in the art will appreciate that meter errors can be minimized by designing the current measurement circuit such that its overall phase angle is at or near the middle of the range of possible voltage input phase angles as adjusted by phase shift circuitry provided in the meter for this purpose.

The embedded coil may be connected so as to produce a phase lead or a phase lag, the principal difference between the two being a 180° phase difference which does not affect the amplitude of the measured current. In multi-phase systems, errors in other parts of the system can be cancelled or reduced by means of such differences in polarity between embedded coils for different phases of the power line.

Integrator 20 includes a resistive input consisting of a magnitude calibration (Mag cal) potentiometer 22 and two resistors, R1 and R2, connected in series between the embedded coil and the inverting input of a TL081I op amp 24. Between the output and inverting input of the op amp a bridged-T network is connected including a T network, consisting of resistors R3, R4 and R5 and capacitor C4, and a bridging capacitor C3, all connected as shown in FIG. 2. The op amp is connected to a power supply and its noninverting input is connected to signal ground, as shown in FIG. 2. The output of the integrator is applied through a resistor R6 to a watt transducer chip or integrated circuit of the type disclosed in U.S. Pat. No. 4,896,106, which is hereby incorporated by reference, for time division multiplication.

Although the integrator output may, if desired, be applied to the input of an amplitude modulator which is contained in the watt transducer chip, with the voltage signal for the corresponding power line applied to the mark-space oscillator in the watt transducer chip, as disclosed in the aforementioned U.S. Pat. No. 4,896,106, the integrator output is preferably connected through R6 to the mark-space oscillator input and the voltage measurement signal is supplied to the amplitude modulator input, in order to reduce the effect of input DC offset voltage which could lower the dynamic range and thereby produce larger meter registration errors at the low end of the load curve. The preferred values of R7 and C5 at the mark-space oscillator input are as listed below. The current signal produced by integrator 20 may alternatively be multiplied by or combined with the voltage measurement in a number of different ways known to those skilled in the art, although the preferred technique is time division multiplication, which is described in further detail in the above-referenced U.S. Pat. No. 4,896,106.

In the preferred embodiment, the values of the above-referenced components are as follows:

| Component | Value |
|---|---|
| Mag cal pot | 0-105 KΩ |
| R1 | 205 KΩ |
| R2 | 159 KΩ |
| R3, R4 | 1 MΩ |
| R5 | 33.2 KΩ |
| R6 | 49.9 KΩ |
| R7 | 100 KΩ |
| C3 | 0.012 μF, NPO ± 5% |
| C4 | 0.1 μF, X7R ± 10% |
| C5 | 0.033 μF |

At least resistors R1-R5 are MIL type RN55C resistors, which have ±1.0% tolerance and a specified temperature coefficient of 50 ppm/°C. The op amp has a JFET input, which is preferred in order to minimize the effect of input bias and offset currents. Resistors R3 and R4 are preferably held to values no greater than 1M in order to keep DC offset within acceptable limits, although it is contemplated that higher values of R3 and R4 and different values of other components may well be acceptable in certain applications and in certain meter designs.

The closed-loop gain and phase of the integrator corresponding to the above-listed values are plotted in FIGS. 3 and 4, respectively, which correspond to the following closed-loop transfer function of integrator 20:

$$G = -k \left[ \frac{s + 18.75}{s^2 + 21.35s + 781.4} \right]$$

where k varies with the Mag cal pot setting (Rcal).

In more general terms, the transfer function of the disclosed integrator takes the following form:

$$G = -\frac{1}{R_{in}C3} \left[ \frac{s + \frac{1}{T_2}}{s^2 + s\left(\frac{T_1 + T_3}{T_1 T_2}\right) + \frac{1}{T_1 T_2}} \right]$$

where $R_{in} = R_s + R_{cal} + R_1 + R_2$ $T_1 = (R3 + R4) C3$ $T_2 = (R5 + R3//R4) C4$ $T_3 = (R5)(C4)$ With the component values specified above, integrator 20 exhibits an underdamped response with an undamped natural frequency of 4.5 Hz and a damping factor $\zeta = 0.38$. Taking both the numerator and denominator terms of the transfer function into account, a magnitude peak occurs at 4.2 Hz, which lies between one and two orders of magnitude or decades below the nominal line frequency of 60 Hz (U.S. standard). Most preferably, the peak occurs at approximately 1/15th of the nominal line frequency, whether it be 60 Hz in the United States or 50 Hz elsewhere. The resulting sensitivity to variations of frequency and to component tolerances is as specified below:

| Variation of Frequency (60 Hz ± 5%) | | | | |
|---|---|---|---|---|
| Freq. (Hz) | Gain[1] | Phase[2] | Error (%)[3] | Error (%)[4] |
| 57 | 1.00320 | 90.43° | 0.32 | 0.06 |
| 60 | 1.00000 | 90.41° | 0 | 0 |
| 63 | 0.99808 | 90.39° | 0.19 | 0.06 |

| Sensitivity to Component Tolerances | | | | |
|---|---|---|---|---|
| Condition | Gain[1] | Phase[2] | Error (%)[3] | Error (%)[4] |
| WCase (max) | 1.06432 | 90.45° | 6.43 | 0.12 |
| Nominal | 1.00000 | 90.41° | 0 | 0 |
| WCase (min) | 0.94223 | 90.38° | 5.78 | 0.09 |

[1] Gain of the integrator/embedded coil combination, normalized with respect to nominal conditions (60 Hz or nominal component values)
[2] Phase of the integrator
[3] Meter registration error due to nonideal magnitude performance of the integrator at PF = 1.0
[4] Meter registration error due to nonideal phase performance of the integrator at PF = 0.5 where
I = actual current value
θ = actual phase angle between voltage and current
I' = measured current value
θ' = measured phase angle between voltage and current.

As an example illustrating the above for a power factor of 0.5, which is known to correspond to a phase angle of 60°, the phase characteristic of the integrator results in a phase error of 0.02° for a 5% variation in frequency, as indicated in the above table. With all other variables unchanged, actual current and voltage equal measured current and voltage such that the equation for meter registration error reduces to the following:

$$\frac{\cos 60.02°}{\cos 60.00°} = 0.9994 \, (-0.06\%)$$

While the component values specified above are particularly advantageous for an embedded coil exhibiting a phase lag of 90.12°, it will be readily appreciated by those skilled in the art that substantially similar performance can be achieved by applying the foregoing general principles to embedded coils and other types of inductive current pickups having different phase characteristics or other nonideal characteristics.

In order to minimize the sensitivity of the inverting input node of the TLO81I op amp to stray capacitive fields, such as due to capacitive coupling from line potential on the potential transformers, power supply transformer and embedded coil primary blades, the integrator circuit layout on the printed circuit board preferably has minimum lead/trace lengths around the op amp inverting node, and electrostatic shielding is also preferably provided around the inverting node. For ease of construction, it is suitable to place an electrostatic shield over the entire op amp circuit.

Although described above in terms of an analog integrator with a single op amp, the integrator function may alternatively be performed using state-variable techniques with multiple op amps, or may be implemented digitally, i.e., with a microprocessor or other programmable digital logic containing an algorithm corresponding to the integrator transfer function and having an input connected to the embedded coil via an A/D converter.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A current measurement circuit for an electrical energy meter, comprising:
   current sensor means for generating a first signal proportional to the derivative of current with respect to time in an electrical power line having a nominal line frequency, said current sensor means having a nonideal phase characteristic including a phase deviation from 90° at said line frequency; and
   underdamped integrator means for integrating said first signal, said integrator means including means for compensating for said phase deviation in said phase characteristic of said current sensor means, said integrator means having a transfer function with a magnitude peak at a frequency below said line frequency and with a phase deviation from 90° at said line frequency.

2. The current measurement circuit of claim 1, wherein said magnitude peak occurs at a frequency of approximately one-fifteenth of said line frequency.

3. The current measurement circuit of claim 2, wherein said phase deviation of said integrator means exceeds said phase deviation of said current sensor means in magnitude.

4. The current measurement circuit of claim 2, wherein said phase deviation of said current sensor means and said phase deviation of said integrator means are approximately equal in magnitude.

5. The current measurement circuit of claim 3, wherein said integrator means further includes a main integrating capacitor less than 0.1 μF in value.

6. The current measurement circuit of claim 5, wherein said integrator means further includes resistor means connected in parallel with said main integrating capacitor for providing a DC impedance path approximately 2 MΩ in value.

7. The current measurement circuit of claim 1, wherein said phase deviation of said integrator means exceeds said phase deviation of said current sensor means in magnitude.

8. The current measurement circuit of claim 1, wherein said integrator means further includes a main integrating capacitor less than 0.1 μF in value, and resistor means connected in parallel with said main integrating capacitor for providing a DC impedance path approximately 2 MΩ in value.

9. An electrical energy meter with a precision integrator for current measurement, comprising:
   means for generating a voltage signal proportional to the voltage on an electrical power line having a nominal line frequency;
   current sensor means for generating a first signal proportional to the derivative of current with respect to time in said electrical power line, said current sensor means having a nonideal phase characteristic including a phase deviation from 90° at said line frequency;
   underdamped integrator means for integrating said first signal to obtain a signal proportional to current, said integrator means including means for compensating for said phase deviation in said phase characteristic of said current sensor means, said integrator means having a transfer function with a magnitude peak at a frequency below said line frequency and with a phase deviation from 90° at said line frequency; and
   means responsive to said voltage signal and said signal proportional to current for determining the power supplied on said power line.

10. The electrical energy meter of claim 9, wherein said integrator means further includes means for limiting meter registration error due to integrator phase characteristics to 0.2% for a 5% variation in frequency.

11. The electrical energy meter of claim 10, wherein said integrator means further includes means for limiting meter registration error due to integrator phase characteristics to 0.2% for worst-case value conditions within tolerance for all passive components in said integrator means.

12. The electrical energy meter of claim 11, wherein said integrator means further includes a capacitor with approximately 10% tolerance.

13. The electrical energy meter of claim 12, wherein said integrator means further includes means for limiting the sensitivity of integrator phase shift to variations in capacitance to less than approximately 0.01° for a 10% change in the value of said capacitor.

14. The electrical energy meter of claim 9, wherein said integrator means further includes means for limiting meter registration error due to integrator phase characteristics to 0.2% for worst-case value conditions within tolerance for all passive components in said integrator means.

15. The electrical energy meter of claim 9, wherein said integrator means further includes means for limiting the sensitivity of integrator phase shift to variations in capacitance to less than approximately 0.01° for a 10% change in the value of a first capacitor.

16. A current measurement circuit for an electrical energy meter, comprising:
   an inductive current pickup; and
   an integrator having an input connected to said inductive current pickup, said integrator including
      an op amp having inverting and noninverting input terminals and an output terminal;
      a purely resistive input impedance connected between said inductive current pickup and said noninverting input of said operational amplifier; and a bridged-T feedback network between said output and inverting input of said op amp, said bridged-T network having a main integrating capacitor in parallel with a T network having two resistors connected in series and commonly connected to a series resistor-capacitor circuit one end of which is connected to signal ground.

17. The current measurement circuit of claim 16, wherein said two resistors connected in series are each approximately 1 MΩ in value.

18. The current measurement circuit of claim 17, wherein said main integrating capacitor is approximately 0.012 µF in value.

19. The current measurement circuit of claim 18, wherein said series resistor-capacitor circuit includes a capacitor with a value of approximately 0.1 µF.

20. The current measurement circuit of claim 19, wherein said series resistor-capacitor circuit includes a resistor with a value of approximately 33 KΩ.

* * * * *

UNITED STATES PATENT AND TRADEMARK OFFICE
CERTIFICATE OF CORRECTION

PATENT NO. : 5,298,857
DATED : March 29, 1994
INVENTOR(S) : John T. Voisine et al.

It is certified that error appears in the above-identified patent and that said Letters Patent is hereby corrected as shown below:

In column 2, line 46, please change "trade-of" to --trade-off--.
In column 3, line 43, please insert a comma after "current".
In column 6, line 41, please insert before "where" the following:

$$\text{Meter registration error} = \frac{VI'\cos\theta'}{VI \cos\theta}$$

Signed and Sealed this

Thirtieth Day of August, 1994

Attest:

BRUCE LEHMAN

Attesting Officer     Commissioner of Patents and Trademarks